(12) United States Patent
Mando

(10) Patent No.: US 8,589,109 B2
(45) Date of Patent: Nov. 19, 2013

(54) SEMICONDUCTOR CIRCUIT, SEMICONDUCTOR CIRCUIT TEST METHOD, AND SEMICONDUCTOR CIRCUIT TEST SYSTEM

(75) Inventor: Takako Mando, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 455 days.

(21) Appl. No.: 13/043,739

(22) Filed: Mar. 9, 2011

(65) Prior Publication Data

US 2012/0029861 A1 Feb. 2, 2012

(30) Foreign Application Priority Data

Aug. 2, 2010 (JP) .................................. 2010-173602

(51) Int. Cl.
*G01R 31/14* (2006.01)
*G21C 17/00* (2006.01)

(52) U.S. Cl.
USPC ........... 702/117; 702/118; 702/182; 702/183; 714/744

(58) Field of Classification Search
USPC ................... 702/117–122, 182, 183; 714/744
See application file for complete search history.

(56) References Cited

U.S. PATENT DOCUMENTS 6,223,318 B1 * 4/2001 Yamashita et al. ............ 714/744

FOREIGN PATENT DOCUMENTS

| JP | 09-113587 | * | 5/1997 |
| JP | 2001-116807 | * | 4/2001 |

* cited by examiner

*Primary Examiner* — Phuong Huynh
(74) *Attorney, Agent, or Firm* — White & Case LLP

(57) ABSTRACT

In general, according to one embodiment, a semiconductor circuit test method is disclosed. The method can generate a basic format of a test pattern and store the basic format in a test device. The basic format includes at least one parameter and a test program for testing a test target semiconductor circuit. The method can set a predetermined value for the parameter to generate the test pattern including the test program and the parameter set to the predetermined value and supply the test pattern to the test target semiconductor circuit. The method can have store the test program in a first address of a storing module in the test target semiconductor circuit and store the parameter set to the predetermined value in a second address of the storing module. In addition, the method can execute the test program stored in the first address while referring to the parameter stored in the second address.

20 Claims, 6 Drawing Sheets

| 131 | 132 | | | 133 | 134 |
|---|---|---|---|---|---|
| TEST PROGRAM<br>*Adr0<br>*Adr1<br>*Adr2 | PARAMETER a | PARAMETER b | PARAMETER c | PROGRAM EXECUTION TIME | OUTPUT EXPECTATION VALUE |

| TEST 1 | TEST 2 | TEST 3 | TEST 4 |
|---|---|---|---|
| PARAMETER a=a1 | PARAMETER a=a2 | PARAMETER a=a3 | PARAMETER a=a4 |
| PARAMETER b=b1 | PARAMETER b=b2 | PARAMETER b=b3 | PARAMETER b=b4 |
| PARAMETER c=c1 | PARAMETER c=c2 | PARAMETER c=c3 | PARAMETER c=c4 |

| TEST PROGRAM | | |
|---|---|---|
| *Adr10 | *Adr20 | *Adr30 | *Adr40 |
| *Adr11 | *Adr21 | *Adr31 | *Adr41 |
| *Adr12 | *Adr22 | *Adr32 | *Adr42 |

131

| PARAMETER a | PARAMETER b | PARAMETER c | PROGRAM EXECUTION TIME | OUTPUT EXPECTATION VALUE |
|---|---|---|---|---|

132 — PARAMETER a, b, c
133 — PROGRAM EXECUTION TIME
134 — OUTPUT EXPECTATION VALUE

13

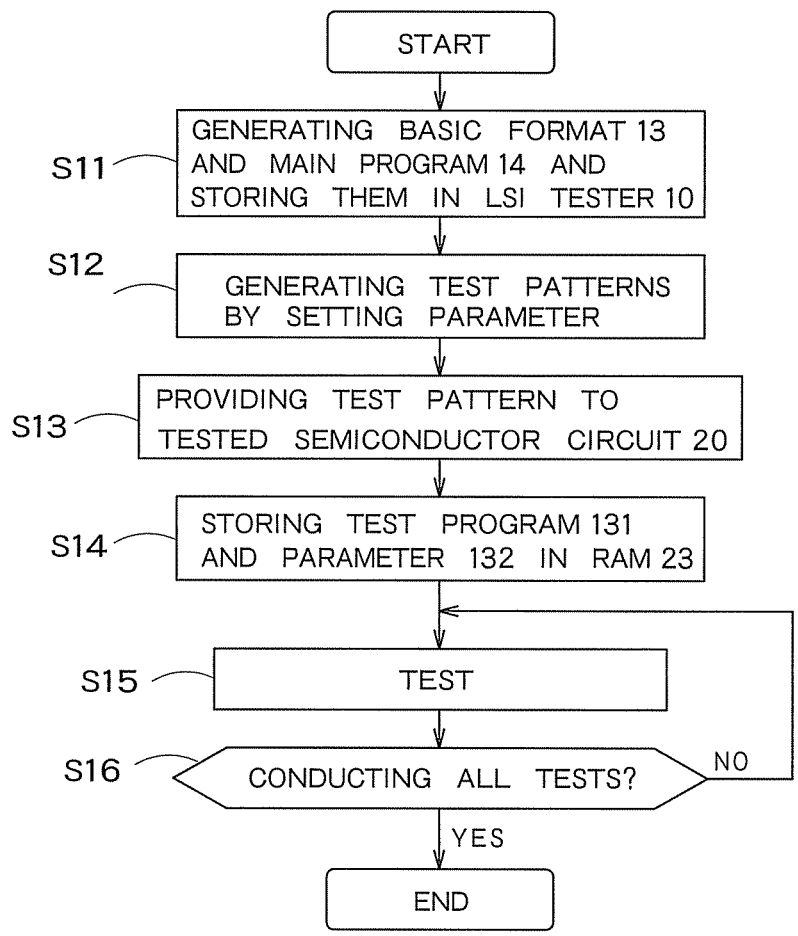
F I G. 7

| ADDRESS | DATA |
|---|---|
| Adr__pgm0 ~ Adr__pgmn | TEST PROGRAM<br><br>*Adr10  *Adr30<br>*Adr11  *Adr31<br>*Adr12  *Adr32<br><br>*Adr20  *Adr40<br>*Adr21  *Adr41<br>*Adr22  *Adr42 |
| Adr10 | a1 |
| Adr11 | b1 |
| Adr12 | c1 |
| Adr20 | a2 |
| Adr21 | b2 |
| Adr22 | c2 |
| Adr30 | a3 |
| Adr31 | b3 |
| Adr32 | c3 |
| Adr40 | a4 |
| Adr41 | b4 |
| Adr42 | c4 |

FIG. 8

SEMICONDUCTOR CIRCUIT, SEMICONDUCTOR CIRCUIT TEST METHOD, AND SEMICONDUCTOR CIRCUIT TEST SYSTEM

CROSS REFERENCE TO RELATED APPLICATIONS

This application is based upon and claims the benefit of priority from the prior Japanese Patent Application No. 2010-173602, filed on Aug. 2, 2010, the entire contents of which are incorporated herein by reference.

FIELD

Embodiments described herein relate generally to a semiconductor circuit, a semiconductor circuit test method, and a semiconductor circuit test system.

BACKGROUND

Generally, a semiconductor circuit is tested by supplying test patterns stored, in advance, in a tester memory in an LSI tester to the semiconductor circuit. When a plurality of tests are conducted, test patterns corresponding to the number of tests should be stored in the tester memory.

The functions of the semiconductor circuit have been complicated in recent years, and the number of tests to be required has also been increased. However, the capacity of the tester memory is limited, which leads to a problem that all test patterns cannot be stored in the tester memory and thus the tests cannot be adequately conducted.

BRIEF DESCRIPTION OF THE DRAWINGS

FIG. 2 is a diagram showing an example of a basic format 13 of a test pattern.

FIG. 3 is a diagram showing an example of the structure of the main program 14.

FIG. 6 is a diagram showing another example of the basic format 13 of the test pattern.

FIG. 7 is a flowchart showing another example of the test steps of the semiconductor circuit 20.

FIG. 8 is a diagram showing an example of the test pattern stored in the RAM 23.

DETAILED DESCRIPTION

In general, according to one embodiment, a semiconductor circuit test method is disclosed. The method can generate a basic format of a test pattern and store the basic format in a test device. The basic format includes at least one parameter and a test program for testing a test target semiconductor circuit. The method can set a predetermined value for the parameter to generate the test pattern including the test program and the parameter set to the predetermined value and supply the test pattern to the test target semiconductor circuit. The method can have store the test program in a first address of a storing module in the test target semiconductor circuit and store the parameter set to the predetermined value in a second address of the storing module. In addition, the method can execute the test program stored in the first address while referring to the parameter stored in the second address.

Embodiments will now be explained with reference to the accompanying drawings.

First Embodiment

Figure 1:
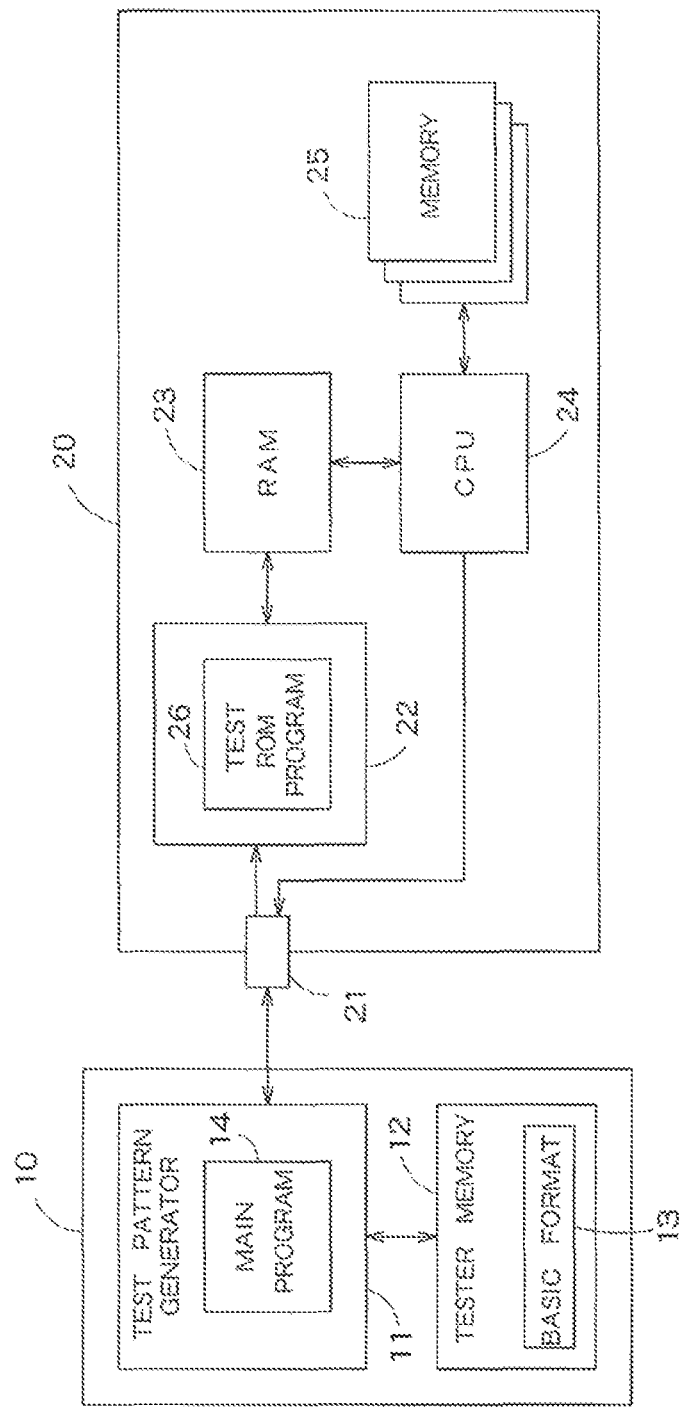
FIG. 1 is a schematic diagram of a semiconductor circuit test system including a semiconductor circuit 20 according to a first embodiment.

FIG. 1 is a schematic diagram of a semiconductor circuit test system including a semiconductor circuit 20 according to a first embodiment. The test system of FIG. 1 has an LSI tester (test device) 10 and the semiconductor circuit 20 to be tested. The LSI tester 10 has a test pattern generator 11 and a tester memory 12. The semiconductor circuit 20 is an LSI for an IC card, for example, and has an input/output pin 21, a controller 22, a RAM (storing module) 23, a CPU (test executing module) 24 and a memory 25.

The LSI tester 10 supplies a test pattern to the semiconductor circuit 20 to test the semiconductor circuit 20. In the present embodiment, an example is shown where the test is conducted on the memory 25 formed of a plurality of pages in the semiconductor circuit 20. More specifically, predetermined data is written in a predetermined address of one or every page in the memory 25, and the address is read to test whether or not the write data matches the read data.

The tester memory 12 in the LSI tester 10 stores a basic format 13 of the test pattern. FIG. 2 is a diagram showing an example of the basic format 13 of the test pattern. The basic format 13 has a test program 131, parameters 132 including parameters "a" to "c", a program execution time 133 and an output expectation value 134.

The test program 131 is a program for testing the memory 25 in the semiconductor circuit 20. The test program 131 includes pointers *Adr0 to *Adr2, the number of which is the same as the number of the parameters 132. These pointers show the addresses of the RAM 23 (to be explained later) in the semiconductor circuit 20, and the parameters 132 stored in the addresses designated by the pointers are referred to when the test program 131 is conducted. As stated above, in the basic format 13 of the present embodiment, the parameters 132 are set in regions different from that of the test program 131.

The test pattern generator 11 sets the parameters "a" to "c" so that the values thereof are different dependent on the test. The parameter "a" shows an initial write address, the parameter "b" shows a write size (the number of pages), and the parameter "c" shows write data.

The program execution time 133 is a time required for the test, which is calculated dependent on the test in advance. For example, the program execution time 133 is set short when only one page among the memory 25 is tested, and is set long when all pages of the memory 25 are tested. The output expectation value 134 is an expectation value of the output obtained as a result of the test. In the present embodiment, the test whether or not the data written in the memory 25 and the data read from the memory 25 match is conducted, and thus an OK code value indicative of matching is set as the output expectation value 134.

The test pattern is obtained by setting the parameters 132 etc. in the basic format 13. In the present embodiment, the tester memory 12 stores only one basic format 13, and thus it is unnecessary to store a plurality of test patterns corresponding to the number of tests.

Note that the basic format 13 of FIG. 2 is merely one example. As long as at least one parameter 132 is set in a region different from that of the test program 131, the basic format 13 can be changed dependent on the test. For example, the number of parameters 132 may be arbitrarily set dependent on the kind of test, and the basic format 13 may further include a "mode setting" and so on incorporated in the semiconductor circuit 20 in advance in order to perform a test which is different from that conducted by the test program 131.

The test pattern generator 11 in the LSI tester 10 of FIG. 1 executes a main program 14 to set predetermined values for the parameters "a" to "c", the program execution time 133, and the output expectation value 134 included in the basic format 13, thereby the test pattern being generated. Then, the test pattern generator 11 supplies the generated test pattern to the semiconductor circuit 20 without storing the generated test pattern in the tester memory 12.

FIG. 3 is a diagram showing an example of the structure of the main program 14. In the example shown in FIG. 3, four tests, namely tests 1 to 4, are conducted. As shown in FIG. 3, when the test pattern generator 11 executes the main program 14, values of "a1", "b1", and "c1" are set for the parameters "a", "b", and "c" of the basic format 13 respectively in order to conduct test 1 firstly. Although not shown in FIG. 3, the program execution time 133 and the output expectation value 134 are also set. The main program 14 may be stored in the tester memory 12 or in a storage area different from the tester memory 12. Because the main program 14 does not include the test program 131 itself, not a large storage capacity is needed.

Here, each of the basic format 13 and the test pattern is serial data having 1-bit data arranged in series. That is, each of them is not a set formed of the address and data, and the correspondence between each bit of the serial data and each of the test program 131, the parameters "a" to "c", the program execution time 133, and the output expectation value 134 is determined in advance.

The test pattern is inputted to the input/output pin 21 of the semiconductor circuit 20 of FIG. 1 from the LSI tester 10 in series. The controller 22 executes a test ROM program 26, stores the test program 131 included in the test pattern in predetermined address Adr_pgm0 to Adr_pgmn (first addresses) of the RAM 23, and stores the parameters "a" to "c" in addresses Adr0 to Adr2 (second addresses), respectively. Here, the pointers *Adr0 to *Adr2 included in the test program 131 correspond to the addresses Adr0 to Adr2 of the RAM 23 respectively.

As stated above, the test pattern is serial data, and the data in the test pattern such as the test program 131 and the parameters 132 is not associated with the address. Further, in the test pattern, the parameters 132 are set in regions different from that of the test program 131. Therefore, the semiconductor circuit 20 extracts each of the test program 131 and the parameters "a" to "c" from the test pattern inputted in series and stores each item in a predetermined address of the RAM 23, which is one of characteristic functions of the present embodiment.

The CPU 24 executes the test program 131 stored in the RAM 23 to test the semiconductor circuit 20. At this time, the parameters "a" to "c" stored in the addresses Adr0 to Adr2 of the RAM 23 corresponding to the pointers *Adr0 to *Adr2 included in the test program 131 are referred to. When the program execution time 133 set in the test pattern by the test pattern generator 11 passes after the test program 131 is executed, the CPU 24 outputs a code value signal indicative of matching or mismatching from the input/output pin 21.

Note that not only the OK code value indicating that the write data and the read data match each other but also an NG code value indicative of mismatching therebetween can be outputted as the output data. Further, it is also possible to obtain the information other than pass/fail information of the test result to improve convenience of the test, by outputting the last address and data read in the test together with the OK code value or by outputting the first mismatching read address and read data together with the NG code value.

Figures 4, 5:
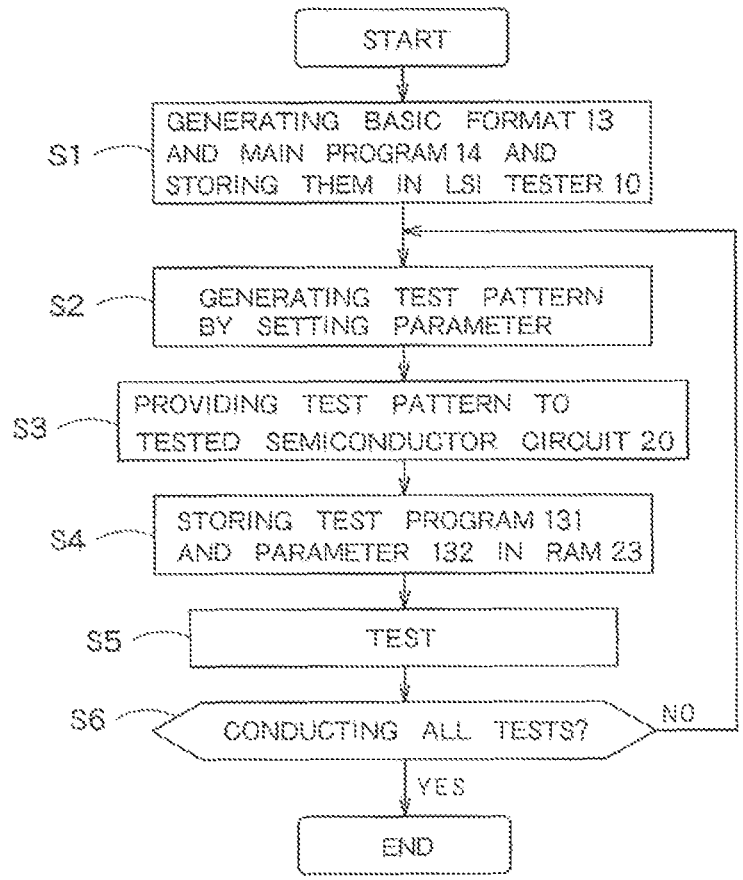
FIG. 4 is a flowchart showing an example of the test steps of the semiconductor circuit 20.
FIG. 5 is a diagram showing an example of the test pattern stored in the RAM 23.

FIG. 4 is a flowchart showing an example of the test steps of the semiconductor circuit 20. Firstly, the basic format 13 shown in FIG. 2 and the main program 14 shown in FIG. 3 are generated in the outside of the LSI tester 10 and stored in the LSI tester 10 (step S1).

Next, the test pattern generator 11 executes the main program 14 to generate a test pattern (step S2). In order to conduct test 1 of FIG. 3 first, the test pattern generator 11 sets "a1", "b1" and "c1" for the parameter "a", "b", and "c", respectively. Since the basic format 13 is serial data formed of 1-bit data, the test pattern generator 11 can easily set the above values for the bits corresponding to the parameters "a" to "c". Then, the test pattern generator 11 supplies the generated test pattern to the controller 22 in the semiconductor circuit 20 through the one input/output pin 21 of the semiconductor circuit 20 (step S3).

The controller 22 supplied with the test pattern executes the test ROM program 26, extracts the test program 131 from the test pattern formed of serial data to store the test program 131 in the addresses Adr_pgm0 to Adr_pgmn of the RAM 23, and extracts the parameters "a" to "c" from the test pattern to store the parameters "a" to "c" in the addresses Adr0 to Adr2 (step S4). FIG. 5 is a diagram showing an example of the test pattern stored in the RAM 23. As shown in FIG. 5, the test program 131 and the parameters 132 are stored in different regions.

Next, the CPU 24 executes the test program 131 stored in the RAM 23 (step S5). More specifically, the CPU 24 writes data "c1" in addresses "a1" to "a1"+"b1" of the memory 25, since "a1", "b1", and "c1" are stored in the addresses Adr0, Adr1, and Adr2 of the RAM 23 corresponding to the pointers *Adr0 to *Adr2 included in the test program 131, respectively. Then, the CPU 24 reads the data written in the same address of the same page. Further, the CPU 24 outputs, from the input/output pin 21, the code value signal indicative of whether or not the write data matches the read data.

In this way, test 1 of the main program 14 shown in FIG. 3 is completed. Since all tests are not completed yet (NO at step S6), in order to conduct test 2, the test pattern generator 11 generates the test pattern by setting "a2", "b2", and "c2" for the parameter "a", "b", and "c", respectively (step S2). Successively, the test is similarly conducted by steps S3 to S5. These steps are repeated until test 4 is conducted, namely, until all tests are conducted (YES at step S6), the test of the semiconductor circuit 20 is completed.

As stated above, in the first embodiment, the basic format 13 of the test pattern having the parameters 132 stored in regions different from that of the test program 131 is generated, and this basic format 13 is stored in the tester memory 12. Then, each time the test is conducted, the test pattern is generated by setting different values for the parameters 132 of the basic format 13 and the test pattern is supplied to the semiconductor circuit 20 without being stored in the tester memory 12. Further, the semiconductor circuit 20 can extract the test program 131 and the parameters 132 from the supplied test pattern to store them in different address of the RAM 23. Therefore, it is enough to stored one basic format 13 in the tester memory 12, and thus the test can be efficiently conducted by using the limited capacity of the tester memory 12.

Second Embodiment

As stated above, in the first embodiment, each time the test is conducted, the test pattern is generated and supplied to the semiconductor circuit 20. On the other hand, in a second embodiment to be explained hereinafter, the test is conducted after every test pattern is supplied to the semiconductor circuit 20.

In the present embodiment, the basic format 13 of the test pattern is different from that of the first embodiment. FIG. 6 is a diagram showing an example of the basic format 13 of the test pattern according to the present embodiment. It is assumed that the four tests shown in FIG. 3 are conducted using the basic format 13 of FIG. 6. The basic format 13 of FIG. 6 is different from that of FIG. 2 in that the test program 131 includes four sets of pointers *Adr10 to *Adr12, *Adr20 to *Adr22, *Adr30 to *Adr32 and *Adr40 to *Adr42. The number of these pointers is equal to the product of the number of parameters and the number of tests (tests 1 to 4) to be conducted. Then, when test 1 is conducted for example, the pointers *Adr10 to *Adr12 are used.

FIG. 7 is a flowchart showing another example of the test steps of the semiconductor circuit 20. Firstly, the basic format 13 shown in FIG. 6 and the main program 14 shown in FIG. 3 are generated in the outside of the LSI tester 10 and stored in the LSI tester 10 (step S11).

Next, the test pattern generator 11 executes the main program 14 to generate a test pattern (step S12). Here, the test pattern generator 11 sets, for the parameter "a", four values "a1" to "a4" corresponding to tests 1 to 4 in FIG. 3. More specifically, "a1" to "a4" are connected in serial and set for the parameter "a". Similarly, the parameter "b", the parameter "c", the program execution time 133, and the output expectation value 134 are set.

Then, the test pattern generator 11 supplies the controller 22 of the semiconductor circuit 20 with the generated test pattern (Step S13). The controller 22 executes the test ROM program 26, extracts the test program 131 from the test pattern to store the test program 131 in the addresses Adr_pgm0 to Adr_pgmn of the RAM 23, and extracts the parameters "a" to "c" from the test pattern to store the parameters "a" to "c" in the addresses Adr10 to Adr12, Adr20 to Adr22, Adr30 to Adr32, and Adr40 to Adr42 (step S14).

FIG. 8 is a diagram showing an example of the test pattern stored in the RAM 23. In the present embodiment, the test ROM program 26 is generated assuming that four values are set for one parameter. Therefore, four values "a1" to "a4" are set for the parameter "a", and the controller 22 stores them in the addresses Adr10, Adr20, Adr30, and Adr40, respectively. The other parameters "b" and "c" are similar to the parameter "a".

After that, the CPU 24 executes the test program 131 stored in the RAM 23 (step S15). Firstly, in order to conduct test 1, the test program 131 refers to the parameters "a1", "b1", and "c1" stored in the addresses corresponding to the pointers *Adr10 to *Adr12. Then, when test 1 is completed, which shows that all the tests are not completed yet (NO at step S16), in order to conduct test 2, the test program 131 refers to the parameters "a2", "b2", and "c2" stored in the addresses corresponding to the pointers *Adr20 to *Adr22. Successively, the remaining tests are conducted referring to different addresses dependent on each test.

When all of tests 1 to 4 are completed (YES at step S16), the test of the semiconductor circuit 20 is completed.

As stated above, in the second embodiment, because the test pattern is generated where a plurality of values are set for one parameter, the test pattern is transferred from the LSI tester 10 to the semiconductor circuit 20 only once. Accordingly, similarly to the first embodiment, the test can be efficiently conducted and the time required for the test can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A semiconductor circuit test method comprising:
a first step configured to generate a basic format of a test pattern and storing the basic format in a test device, the basic format including at least one parameter and a test program for testing a test target semiconductor circuit;
a second step configured to set a predetermined value for the parameter to generate the test pattern including the test program and the parameter set to the predetermined value and supplying the test pattern to the test target semiconductor circuit;
a third step configured to store the test program in a first address of a storing module in the test target semiconductor circuit and storing the parameter set to the predetermined value in a second address of the storing module; and
a fourth step configured to execute the test program stored in the first address while referring to the parameter stored in the second address.

2. The method of claim 1, wherein after the fourth step, the second to fourth steps are performed a plurality of times while changing a value to be set for the parameter.

3. The method of claim 1, wherein upon the second step, a plurality of values are set for the parameter to be supplied to the test target semiconductor circuit,
upon the third step, the plurality of values are stored in corresponding addresses of the storing module respectively, and
upon the fourth step, the test program is executed while referring to the parameter set to one of the plurality of values.

4. The method of claim 1, wherein the test program includes at least a pointer for referring to the parameter, and
upon the fourth step, the parameter is referred to based on the pointer.

5. The method of claim 4, wherein the number of the pointer included in the test program is equal to the number of the parameter or equal to a product of the number of the parameter and the number of test to be conducted.

6. The method of claim 4, wherein the pointer corresponds to the second address of the storing module.

7. The method of claim 1, wherein the test pattern is serial data, and
the test pattern is supplied to the test target semiconductor circuit through one input pin of the test target semiconductor circuit.

8. The method of claim 1, wherein the test program is a program to test a memory comprising a plurality of pages in the test target semiconductor circuit, and
the parameter comprises:
an initial write address of the memory;
the number of write pages; and
write data.

9. The method of claim 1, wherein the basic format includes a program execution time indicative of a time required for a test, the program execution time being calculated dependent on the test in advance.

10. The method of claim 1, wherein the basic format includes an output expectation value indicative of an expectation value of an output obtained as a result of a test on the test target semiconductor circuit.

11. A semiconductor circuit comprising:
an input pin a test pattern is inputted to, the test pattern including at least one parameter set to a predetermined value and a test program;
a storing module configured to store the test pattern;
a controller configured to store the test pattern in a first address of the storing module and to store the parameter set to the predetermined value in a second address of the storing module; and
a test executing module configured to execute the test program stored in the first address while referring to the parameter stored in the second address.

12. The circuit of claim 11, wherein the test program includes a pointer for referring to the parameter, and
the test executing module is configured to refer the parameter based on the pointer.

13. The circuit of claim 12, wherein the number of the pointer included in the test program is equal to the number of the parameter or equal to a product of the number of the parameter and the number of tests to be conducted.

14. The circuit of claim 12, wherein the pointer corresponds to the second address of the storing module.

15. The circuit of claim 11, wherein the storing module is configured to store the parameter set to a value for one test or store the parameter set to values for all of tests to be conducted.

16. The circuit of claim 11, wherein the test pattern is serial data, and
the test pattern is supplied through one input pin.

17. The circuit of claim 11, wherein the test program is a program to test a memory comprising a plurality of pages, and
the parameter comprises:
an initial write address of the memory;
the number of write pages; and
write data.

18. The circuit of claim 11, wherein the basic format includes a program execution time indicative of a time required for a test, the program execution time being calculated dependent on the test in advance.

19. The circuit of claim 11, wherein the basic format includes an output expectation value indicative of an expectation value of an output obtained as a result of a test on the semiconductor circuit.

20. A semiconductor circuit test system comprising:
a test target semiconductor circuit; and
a test device configured to generate a test pattern including at least a parameter set to a predetermined value and a test program,
wherein the semiconductor circuit comprises:
an input pin the test pattern is inputted to;
a storing module configured to store the test pattern;
a controller configured to stored the test pattern in a first address of the storing module and to store the parameter set to the predetermined value in a second address of the storing module; and
a test executing module configured to execute the test program stored in the first address while referring to the parameter stored in the second address.

* * * * *